(12) United States Patent
Xia et al.

(10) Patent No.: US 8,719,458 B2
(45) Date of Patent: May 6, 2014

(54) APPARATUS AND METHODS FOR COMMUNICATING WITH PROGRAMMABLE DEVICES

(71) Applicant: Altera Corporation, San Jose, CA (US)

(72) Inventors: Renxin Xia, San Jose, CA (US); Juju Joyce, Sunnyvale, CA (US); Nitin Prasad, San Jose, CA (US); Kerry Veenstra, Santa Cruz, CA (US); Keith Duwel, San Jose, CA (US)

(73) Assignee: Altera Corporation, San Jose, CA (US)

(*) Notice: Subject to any disclaimer, the term of this patent is extended or adjusted under 35 U.S.C. 154(b) by 0 days.

(21) Appl. No.: 14/025,680

(22) Filed: Sep. 12, 2013

(65) Prior Publication Data

US 2014/0015565 A1  Jan. 16, 2014

Related U.S. Application Data

(60) Continuation of application No. 13/461,592, filed on May 1, 2012, now Pat. No. 8,554,959, which is a continuation of application No. 12/629,900, filed on Dec. 3, 2009, now Pat. No. 8,190,787, which is a continuation of application No. 12/037,935, filed on Feb. 27, 2008, now Pat. No. 7,650,438, which is a division of application No. 10/457,874, filed on Jun. 10, 2003, now Pat. No. 7,356,620.

(51) Int. Cl.
*G06F 3/00* (2006.01)
*G06F 13/00* (2006.01)

(52) U.S. Cl.
USPC ............. 710/8; 710/104; 713/1; 714/725

(58) Field of Classification Search
USPC ....... 710/8–14, 104; 713/1; 714/725; 365/63, 365/159.07, 238.5, 185.23; 341/55, 100; 716/16; 348/211.99; 326/40
See application file for complete search history.

(56) References Cited

U.S. PATENT DOCUMENTS

| | | |
|---|---|---|
| 4,642,487 A | 2/1987 | Carter |
| 4,870,302 A | 9/1989 | Freeman |
| RE34,363 E | 8/1993 | Freeman |
| 5,493,239 A | 2/1996 | Zlotnick |
| 5,524,243 A | 6/1996 | Gheorghiu |
| 5,638,851 A | 6/1997 | Baldwin |
| 5,640,106 A | 6/1997 | Erickson et al. |
| 5,640,107 A | 6/1997 | Kruse |
| 5,689,516 A | 11/1997 | Mack et al. |

(Continued)

FOREIGN PATENT DOCUMENTS

| | | |
|---|---|---|
| GB | 2 350 456 A | 11/2000 |
| WO | WO 96/35263 | 11/1996 |
| WO | WO 02/103908 A1 | 12/2002 |

OTHER PUBLICATIONS

Altera Application Note 33, "Configuring FLEX 8000 Devices," Mar. 1993, Ver. 1, pp. 1-48.

(Continued)

*Primary Examiner* — Christopher Shin
(74) *Attorney, Agent, or Firm* — Ropes & Gray LLP

(57) ABSTRACT

A circuit arrangement includes a programmable logic device. The programmable logic device includes configuration logic circuitry. The programmable logic device also includes configurable interconnects. The circuit arrangement further includes a storage device configured to provide data to the programmable logic device. The storage device communicates with the programmable logic device via a bi-directional interface.

20 Claims, 10 Drawing Sheets

(56) References Cited

U.S. PATENT DOCUMENTS

| | | |
|---|---|---|
| 5,760,607 A | 6/1998 | Leeds et al. |
| 5,794,033 A | 8/1998 | Aldebert et al. |
| 5,804,986 A | 9/1998 | Jones |
| 5,848,026 A | 12/1998 | Ramamurthy et al. |
| 6,034,538 A | 3/2000 | Abramovici |
| 6,102,963 A | 8/2000 | Agrawal |
| 6,198,303 B1 | 3/2001 | Rangasayee |
| 6,215,689 B1 | 4/2001 | Chhor et al. |
| 6,255,849 B1 | 7/2001 | Mohan |
| 6,259,271 B1 | 7/2001 | Couts-Martin et al. |
| 6,292,116 B1 | 9/2001 | Wang et al. |
| 6,307,877 B1 | 10/2001 | Philips et al. |
| 6,363,019 B1 | 3/2002 | Erickson et al. |
| 6,366,117 B1 | 4/2002 | Pang et al. |
| 6,425,077 B1 | 7/2002 | Le et al. |
| 6,438,737 B1 | 8/2002 | Morelli et al. |
| 6,507,425 B1 | 1/2003 | Dewberry et al. |
| 6,525,678 B1 | 2/2003 | Veenstra et al. |
| 6,538,468 B1 | 3/2003 | Moore |
| 6,553,523 B1 | 4/2003 | Lindholm et al. |
| 6,553,526 B1 | 4/2003 | Shephard, III |
| 6,618,686 B2 | 9/2003 | Allamsetty |
| 6,629,311 B1 | 9/2003 | Turner et al. |
| 6,631,520 B1 | 10/2003 | Theron et al. |
| 6,673,263 B2 | 1/2004 | Albu et al. |
| 6,687,814 B1 | 2/2004 | Duppong |
| 6,748,456 B1 | 6/2004 | Stanton et al. |
| 6,787,648 B2 | 9/2004 | Tyrrell et al. |
| 6,828,823 B1 | 12/2004 | Tsui et al. |
| 6,851,047 B1 | 2/2005 | Fox et al. |
| 6,857,110 B1 | 2/2005 | Rupp et al. |
| 6,907,595 B2 | 6/2005 | Curd et al. |
| 6,920,627 B2 | 7/2005 | Blodget et al. |
| 6,937,493 B2 | 8/2005 | Krause et al. |
| 6,948,147 B1 | 9/2005 | New et al. |
| 7,278,128 B1 | 10/2007 | Trimberger |
| 7,356,620 B2 | 4/2008 | Xia et al. |
| 7,373,668 B1 | 5/2008 | Trimberger |
| 7,389,429 B1 | 6/2008 | Trimberger |
| 7,650,438 B2 | 1/2010 | Xia et al. |
| 7,681,233 B1 | 3/2010 | Fox et al. |
| 7,979,827 B1 | 7/2011 | Trimberger et al. |
| 8,190,787 B2 | 5/2012 | Xia et al. |
| 2001/0003844 A1 | 6/2001 | Cliff et al. |
| 2001/0015919 A1 | 8/2001 | Kean |
| 2001/0056558 A1 | 12/2001 | Couts-Martin et al. |
| 2003/0160633 A1 | 8/2003 | Terrill et al. |
| 2004/0098549 A1 | 5/2004 | Dorst |
| 2006/0038586 A1 | 2/2006 | Xia et al. |

OTHER PUBLICATIONS

Altera Application Note 38, "Configuring Multiple FLEX 8000 Devices," Mar. 1994, Ver. 1, pp. 1-20.

Altera Application Note 38, "Configuring Multiple FLEX 8000 Devices," May 1994, Ver. 2.01, pp. 71-90.

Copending Patent Application, Edward Flaherty et al., "Configuration and/or Reconfiguration of Integrated Circuit Devices That Include Programmable Logic and Microprocessor Circuitry," filed Jun. 12, 2001, 34 Pages.

Kean, "Secure Configuration of Field Programmable Gate Arrays," FDL 2001, LNCS 2147, pp. 142-151 (2001) © Springer-Verlag Berlin Heidelberg 2001.

Xilinx Application Note, "Configuring Virtex FPGAs From Parallel EPROMs With a CPLD," XAPP 137, Mar. 1, 1999, Ver 1.0 pp. 1-7.

US 8,719,458 B2

APPARATUS AND METHODS FOR COMMUNICATING WITH PROGRAMMABLE DEVICES

This application is a continuation of U.S. Pat. application Ser. No. 13/461,592, filed May 1, 2012 (U.S. Pat. No. 8,554,959), which is a continuation of U.S. patent application Ser. No. 12/629,900, filed Dec. 3, 2009 (U.S. Pat. No.8,190,787), which is a continuation of U.S. patent application Ser. No. 12/037,935, filed Feb. 27, 2008, (U.S. Pat. No. 7,650,438) which is a divisional of U.S. patent application Ser. No. 10/457,874, filed Jun. 10, 2003, (U.S. Pat. No. 7,356,620) all of which are hereby incorporated by reference.

TECHNICAL FIELD

This patent application relates generally to logic circuitry and programmable logic devices (PLDs) and, more particularly, to communicating with, and configuring, PLDs.

BACKGROUND

PLDs have increasingly proliferated in many areas of technology, such as data processing and signal processing applications. The inherent flexibility of the PLD and the ability to re-configure the PLD have in part led to their popularity. System designers and even system end-users can program the PLDs and re-configure the functionality of part or all of the system. Re-configuring the system avoids costly and time-consuming re-design of the system or its various components or sub-systems.

Configuring a PLD typically involves providing configuration data to the PLD. Conventional systems use configuration memories such as a read-only memory (ROM), an erasable programmable ROM (EPROM), or an electrically erasable programmable ROM (EEPROM) to store the configuration data. These configuration memories, however, have certain disadvantages. First, they have a relatively high cost, but relatively low density. Second, even in the case of EEPROMs (to which one can write information), the PLD or the user does not have access to any unused capacity of the memory. In other words, the unused capacity of the EEPROM is not available to either the PLD or the user and is "wasted." Third, conventional configuration memories or devices typically use additional logic circuitry (such as a processor or controller) that tends to increase costs. A need exists for a low-cost configuration device that overcomes the disadvantages of the conventional solutions.

SUMMARY

This invention relates to communicating with, and configuring, PLDs. One aspect of the invention concerns apparatus for communicating with, and configuring, PLDs. In one embodiment, a circuit arrangement according to the invention includes a PLD and a storage device. The storage device is adapted to communicate information with the PLD. The storage device is further adapted to communicate with the programmable logic device via a bi-directional interface. More specifically, the information may constitute configuration information or data.

In another embodiment, an apparatus according to the invention includes a first PLD coupled in a cascade arrangement to a second PLD. The apparatus also includes a storage device. The storage device communicates with the first and second PLDs via a bi-directional interface. More specifically, the storage device may communicate configuration data to the first and second PLDs.

Another aspect of the invention concerns methods of communicating with, and configuring, PLDs. In one embodiment, a method of communicating information between a PLD and a storage device includes providing the PLD and providing the storage device. The method further includes retrieving the information from the storage device, and communicating the information to the PLD via a bi-directional interface.

In another embodiment, a method of communicating information includes providing a first PLD, and a second PLD coupled to the first PLD in a cascade arrangement. The method also includes providing a storage device. The method further includes retrieving the information from the storage device, and communicating the information to the first PLD via a bi-directional interface. More specifically, the method also includes communicating the information to the second PLD via the bi-directional interface.

BRIEF DESCRIPTION OF THE DRAWINGS

The appended drawings illustrate only exemplary embodiments of the invention and therefore should not be considered as limiting its scope. The disclosed inventive concepts lend themselves to other equally effective embodiments. In the drawings, the same numeral designators used in more than one drawing denote the same, similar, or equivalent functionality, components, or blocks.

DESCRIPTION OF EXEMPLARY EMBODIMENTS

This invention contemplates apparatus for configuration of PLDs using external storage devices, such as FLASH memories. The configuration apparatus may use a bi-directional "smart" or "intelligent" interface between the PLD and the FLASH memory. Using that interface, the PLD may communicate with the storage device to obtain information about the storage device, store information in the storage device, or obtain information from the storage device.

The configuration apparatus according to the invention provide several advantages. First, they allow the PLD to act as a master and obtain configuration data from the storage device (the slave device), thus obviating a need for an external host or logic circuitry to perform that task. In circuit arrangements that include more than one PLD, the configuration apparatus according to the invention can support a master PLD and one or more slave PLDs (e.g., multiple PLDs acting as slave devices). Alternatively, the configuration apparatus according to the invention can support multiple PLDs, each acting as a master PLD.

Second, the configuration apparatus according to the invention provide in-system programming (ISP) by using a cable or similar coupling mechanism. Third, the novel configuration apparatus allow the user to access the storage device after configuration has concluded. If the storage device has any storage area(s) not used by the configuration data, the user may use the unused area(s). Fourth, an external device or host may gain access to the storage device once PLD configuration has ended. If the storage device has any storage area(s) not used by the configuration data, the external device or host may use the unused area(s). Finally, by using a serial bi-directional interface between the PLD and the storage device, one may reduce the number of interconnects between the two devices, thus lower overall system cost, save materials, increase reliability, etc.

Figure 1:
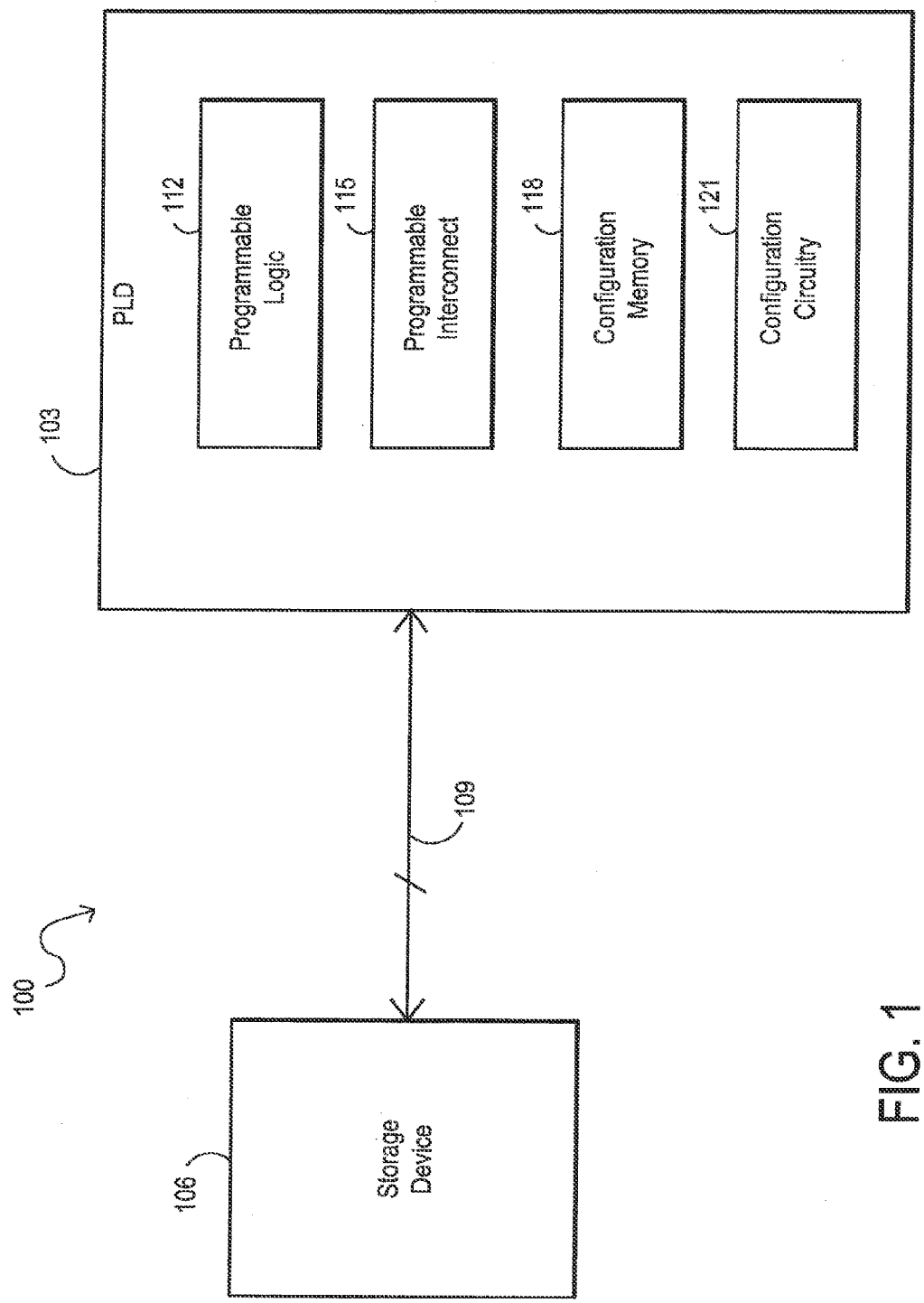
FIG. 1 shows a circuit arrangement for PLD configuration according to the invention.

FIG. 1 shows a circuit arrangement 100 for PLD configuration according to the invention. Circuit arrangement 100 includes PLD 103 and storage device 106. PLD 103 includes programmable logic 112, programmable interconnect 115, and configuration memory 118. Programmable logic 112 includes blocks of configurable or programmable logic circuitry, such as look-up tables (LUTs), product-term logic, multiplexers, logic gates, registers, memory, and the like. Programmable interconnect 115 couples to programmable logic 112 and allows the establishment of configurable interconnects (coupling mechanisms) between various blocks within programmable logic 112.

Configuration memory 118 operates in conjunction with PLD configuration circuitry 121. Upon power-up or reset, PLD configuration circuitry 121 accesses storage device 106 via bi-directional interface 109 to obtain configuration data. PLD configuration circuitry 121 stores the configuration data in configuration memory 118. Configuration memory 118 couples to programmable logic 112 and programmable interconnect 115. The configuration data within configuration memory 118 determine the functionality of PLD 103 by programming programmable logic 112 and programmable interconnect 118, as persons skilled in the art with the benefit of the description of the invention understand.

PLD 103 couples to storage device 106 via bi-directional interface 109. Unlike conventional interfaces between PLDs and external configuration memories, bi-directional interface 109 provides a "smart" or "intelligent" interface between PLD 103 and storage device 106. Using bi-directional interface 109, PLD 103 may make several determinations about storage device 106, as desired.

Upon power-up or reset, PLD configuration circuitry 121 in PLD 103 may first determine the presence, functionality, characteristics, and the like, of storage device 106. If storage device 106 is absent or does not function or respond properly, PLD 103 may generate an error signal or otherwise alert the user or another host or device. If storage device 106 is present and functioning, PLD configuration circuitry 121 may ascertain additional information about storage device 106, such as its type (e.g., whether it is a FLASH memory), its status, its capacity, and/or its availability.

Figure 2:
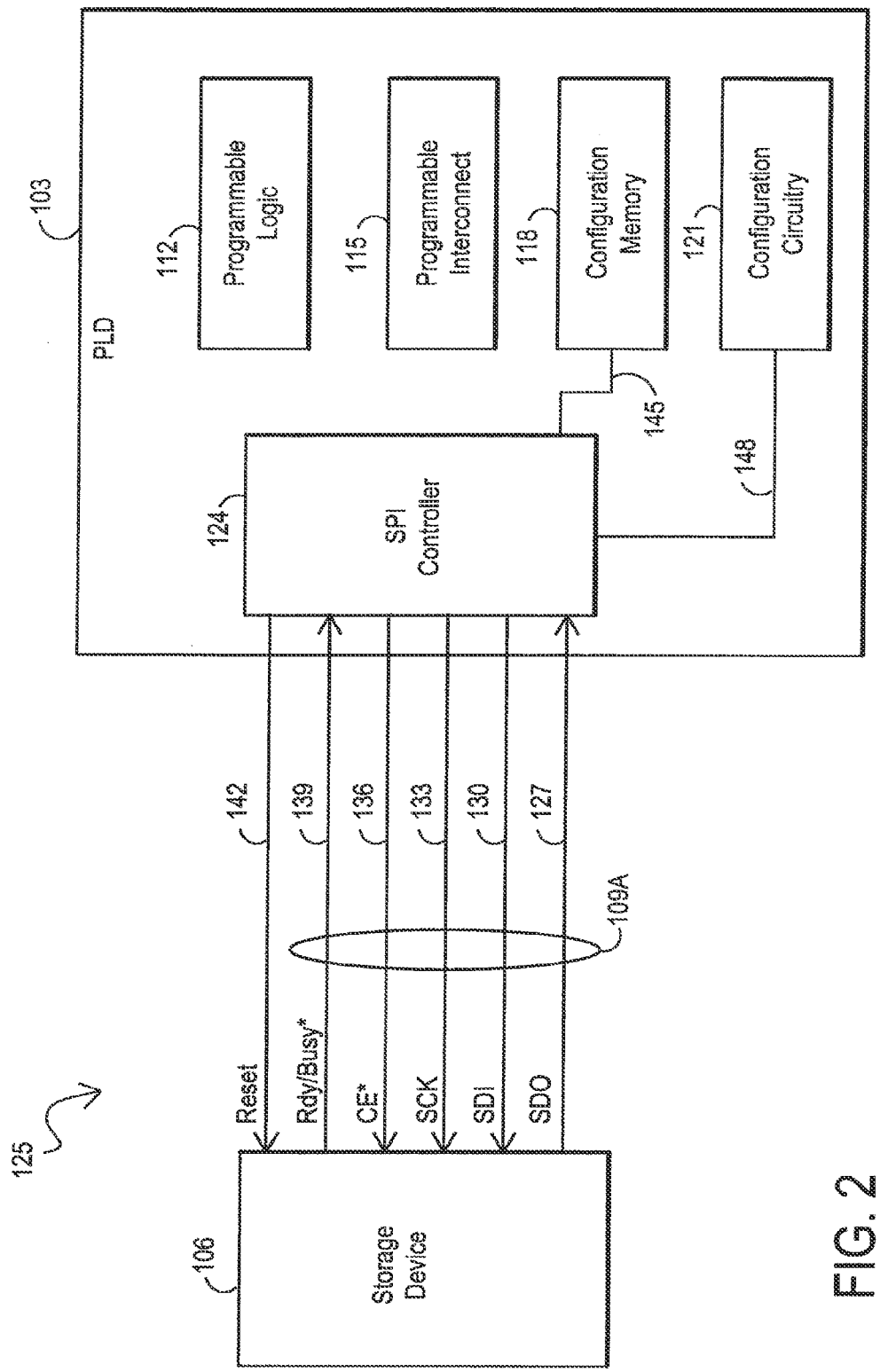
FIG. 2 illustrates an exemplary embodiment of circuit arrangement for PLD configuration according to the invention that includes a bi-directional serial interface.

In illustrative embodiments of the invention, bi-directional interface 109 may constitute a bi-directional serial interface. FIG. 2 shows an exemplary embodiment of circuit arrangement 125 for PLD configuration according to the invention that includes bi-directional serial interface 109A. Bi-directional serial interface 109A includes serial data-out (SDO) signal 127, serial data-in signal (SDI) signal 130, serial clock (SCK) signal 133, chip-enable (CE*) signal 136 (the "*" notation denotes an active-low digital signal), and hand-shaking (RdyBusy*) signal 139. In addition, PLD 103 may supply a reset (Reset) signal 142 to storage device 106 to reset storage device 106 (for example, at power-up).

Serial data-out (SDO) signal 127 provides serial data from storage device 106 to PLD 103. In contrast, serial data-in (SDI) signal 130 supplies serial data from PLD 103 to storage device 106. Serial clock (SCK) signal 133 communicates clock signals from PLD 103 to storage device 106. Chip-enable (CE*) signal 136 allows PLD 103 to select storage device 106 for communication. Through hand-shaking (Rdy/Busy*) signal 139, storage device 106 may signal to PLD 103 its availability or lack of availability for serial communication with PLD 103. In addition to PLD 103, one may use the above signals to provide communication between storage device 106 and an external device or host, as desired.

Bi-directional serial interface 109A may include fewer, more, or different signals than the signals in FIG. 2, as desired. Generally, one may use virtually any desired bi-directional serial interface between PLD 103 and storage device 106. The serial communication between PLD 103 and storage device 106 may use any serial communication protocol and type and number of signals, as desired, and as persons of ordinary skill in the art with the benefit of the description of the invention understand.

PLD 103 includes serial-port interface (SPI) controller 124 (generally, a serial-interface controller). SPI controller 124 includes circuitry for communicating with storage device 106 via bi-directional serial interface 109A. Through SPI controller 124, PLD configuration circuitry 121 causes PLD 103 to obtain configuration data from storage device 106. SPI controller 124 provides the configuration data to configuration memory 118. The data in configuration memory 118 determine the functionality of PLD 103 by programming programmable logic 112 and programmable interconnect 115, as persons of ordinary skill in the art with the benefit of the description of the invention understand.

Using serial interface 109A to provide a communication mechanism between storage device 106 and PLD 103 has several advantages. A serial interface saves pins, conductors, and/or connectors, because the data transmission and reception typically takes place over two conductors (or lines or wires). Using fewer conductors also lowers the cost and complexity of various components and, hence, the overall system. For example, the printed circuit board (PCB) that couples PLD 103 to storage device 106 uses fewer conductors for a serial interface and therefore costs less. Likewise, the fact that a serial interface uses relatively few conductors to accomplish communication between PLD 103 and storage device 106 tends to increase the PCB's, and the overall systems, reliability.

Figure 3:
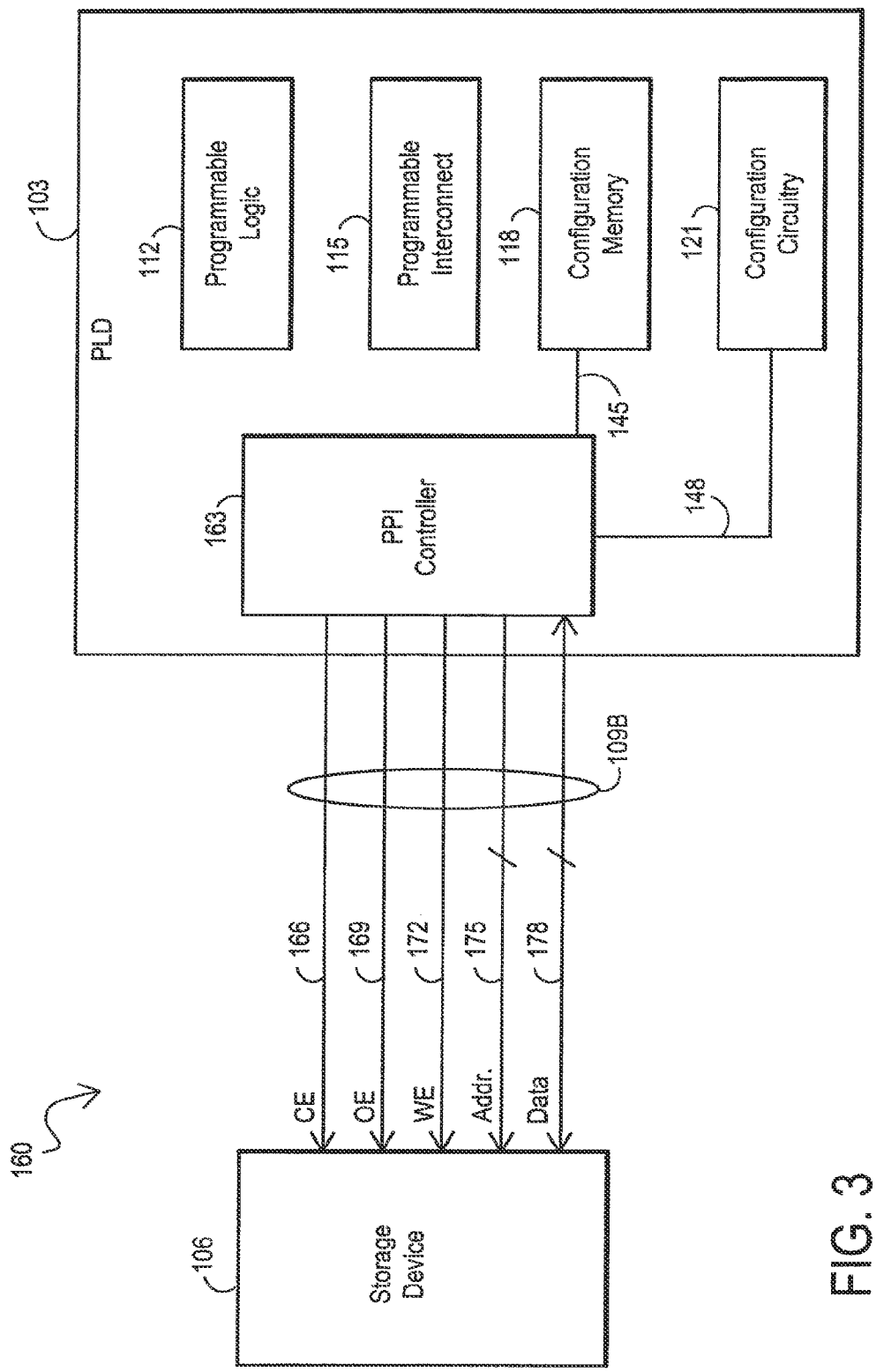
FIG. 3 depicts an exemplary embodiment of circuit arrangement for PLD configuration according to the invention that includes a bi-directional parallel interface.

Rather than using a serial interface, one may couple PLD 103 and storage device 106 via a parallel interface, as desired. FIG. 3 shows an exemplary embodiment of circuit arrangement 160 for PLD configuration according to the invention that includes bi-directional parallel interface 109B. Bi-directional parallel interface 109B includes data signals 178, address signals 175, write-enable (WE) signal 172, output-enable (OE) signal 169, and chip-enable (CE) signal 166. In addition, PLD 103 may supply a reset signal (not shown in FIG. 3) to storage device 106 to reset storage device 106 (for example, at power-up).

Data signals 178 allow PLD 103 (or an external device or host, as desired) to exchange (i.e., send and receive) data with storage device 106. Thus, PLD 103 may communicate data to storage device 106 via data signals 178. Alternatively, PLD 103 may receive data from storage device 106 through data signals 178. If used, an external device or host (not shown in FIG. 3) may communicate data to/from PLD 103 and/or storage device 106 via data signals 178, as desired.

Address signals 175 facilitate the exchange of data between PLD 103 (or an external device or host, as desired) and storage device 106. Address signals 175 function as conventional address signals do. In other words, address signals 175 specify a location (or locations) to which PLD 103 seeks to write data, or from which PLD 103 seeks to read data. If used, an external device or host (not shown in FIG. 3) may communicate address signals to storage device 106 to facilitate data exchange operations with storage device 106, as desired.

Write-enable (WE) signal 172 facilitates a write operation to storage device 106. More particularly, WE signal 172 enables storage device to write the data specified by data signals 178 to the location in storage device 106 specified by address signals 175. Output-enable (OE) signal 169 enables the output signals of storage device 106 in response to a signal applied by PLD 103 (or an external device or host, as desired). For example, OE signal 164 enables storage device 106 to output data via data signals 178. Chip-enable (CE) signal 166 allows PLD 103 to select storage device 106 for communication.

Bi-directional parallel interface 109B may include fewer, more, or different signals than the signals in FIG. 3, as desired. Generally, one may use virtually any desired bi-directional parallel interface between PLD 103 and storage device 106. The parallel communication between PLD 103 and storage device 106 may use any parallel communication protocol and type and number of signals, as desired, and as persons of ordinary skill in the art with the benefit of the description of the invention understand.

Referring to the embodiment shown in FIG. 3, PLD 103 includes parallel-port interface (PPI) controller 163. PPI controller 163 includes circuitry for communicating with storage device 106 via bi-directional parallel interface 109B. Through PPI controller 163, PLD configuration circuitry 121 causes PLD 103 to obtain configuration data from storage device 106. PPI controller 163 provides the configuration data to configuration memory 118. The data in configuration memory 118 determine the functionality of PLD 103 by programming programmable logic 112 and programmable interconnect 115, as persons of ordinary skill in the art with the benefit of the description of the invention understand.

Using parallel interface 109B to provide a communication mechanism between storage device 106 and PLD 103 may provide some advantages. Although a parallel interface uses more conductors than does a serial interface, a parallel interface tends to communicate data at much higher rates than a comparable serial interface. Thus, although parallel interfaces tend to cost more than serial interfaces, they provide higher performance. Depending on various factors, such as design and performance specifications for a given application, one may use either a serial interface or a parallel interface, as persons skilled in the art with the benefit of the description of the invention understand. By balancing cost, performance, reliability, and the like, one may apply each interface in a suitable implementation to help achieve the design goals and specifications.

In illustrative embodiments of the invention, storage device 106 may constitute a FLASH memory. In contrast to conventional PLD configuration circuits, the FLASH memory provides for an intelligent communication link to PLD 103 via the bi-directional links described here, such as the serial interface shown in FIG. 2 or the parallel interface shown in FIG. 3. PLD 103 may communicate with the storage device to obtain information about the FLASH memory, store information in it, or obtain information from it, as described above.

Depending on the application, one may use either a serial FLASH memory or a parallel FLASH memory, as desired. More specifically, referring to FIG. 2, one may use a serial FLASH memory as storage device 106 to communicate with PLD 103 (or an external device or host) via bi-directional serial interface 109A. In contrast, referring to FIG. 3, one may use a parallel FLASH memory as storage device 106 to communicate with PLD 103 (or an external device or host) via bi-directional parallel interface 109B.

Flash memories typically respond to commands or operation codes (or op codes) that an external device provides. In the circuit arrangements shown in FIG. 2 and FIG. 3, PLD 103 may provide various op codes to FLASH memory, such as an op code for reading data from a certain location in the FLASH memory. The FLASH memory responds by executing the command or op code.

More specifically, at power-up (or on reset or similar event), PLD 103 acts as a master. PLD 103 includes hard-wired logic (e.g., a state machine) that "bootstraps" PLD 103 at power-up. The hard-wired logic sends commands or op code to the FLASH memory to initiate the configuration process. The FLASH memory responds to the commands and performs configuration by sending configuration data to PLD 103. This process continues until the FLASH memory has provided all of the configuration data to PLD 103. At that point, the configuration process completes.

Note that, rather than using FLASH memory, one may use other types of memory as storage device 106, as desired. For example, one may use an EEROM or EEPROM. The choice of storage device 106 depends on the design and performance specifications for a given application and falls within the knowledge of persons of ordinary skill in the art who have the benefit of the description of the invention.

As noted above, PLD 103 or an external device or host (not shown in FIGS. 1 and 2) may access and use storage device 106 at the conclusion of the configuration of PLD 103. Of course, at the conclusion of the configuration process, PLD 103 or another device need not access storage device 106 or conduct any transactions with it, as desired. As another option, however, the user may access storage device 106 through serial interface 109A or parallel interface 109B. The user may do so via the programmed functionality of PLD 103, or through an external device or host, as desired.

Thus, rather than leave storage device 106 idle at the conclusion of the configuration process, the user may read data from storage device 106 and write data to storage device 106 (depending, of course, on the type of storage device 106 used, for example, a FLASH memory). In this manner, the user may access the configuration data within storage device 106, as desired. The user may not only read the configuration data, but may also modify the configuration data.

For example, based on input from an external device or host, and/or performance data from the configured PLD, the user may wish to change various system or sub-system parameters, such as communication protocols or parameters, filter coefficients, and the like. Furthermore, PLD 103 may receive configuration data (for example, data packets from a network) from a source, such as an external device or host or a network, and write them to storage device 106 for future re-configuration of PLD 103. Thus, the user may change the characteristics of the logic implemented in PLD 103 in a dynamic and flexible manner by storing information to storage device 106. Put another way, PLD 103 may self-configure, thus giving the user increased flexibility and control over the overall system characteristics and performance.

Figure 4:
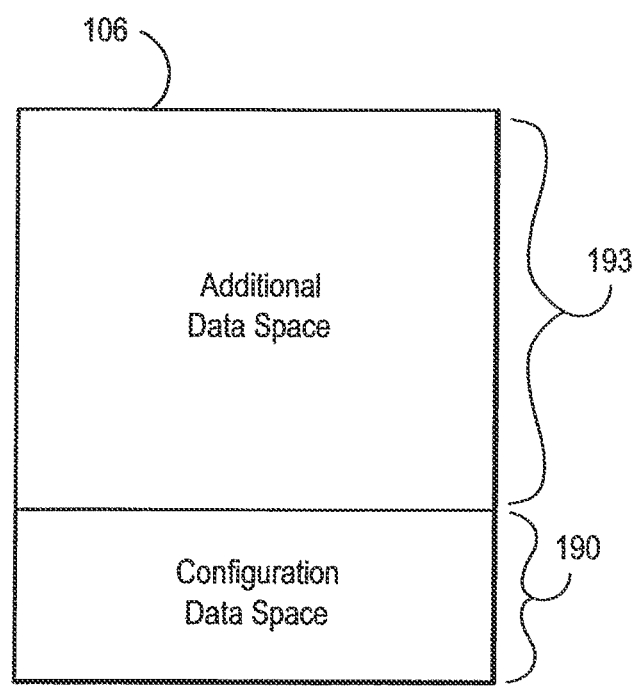
FIG. 4 shows a memory map of a storage device in an illustrative embodiment according to the invention.

Furthermore, the user may use storage device 106 as additional system storage, as desired, allowing the user the benefit of any unused capacity of storage device 106. FIG. 4 shows a memory map of storage device 106 in an illustrative embodiment according to the invention. The data space within storage device 106 includes configuration data space 190 and additional data space 193. Configuration data space 190 stores the configuration data for PLD 103. As described above, storage device 106 provides the configuration data to PLD 103 at appropriate times (for example, at power-up).

Additional data space 193 represents the unused capacity of storage device 106. In other words, additional data space 193 denotes the memory capacity of storage device 106 that the user (through PLD 103) or an external device or host may access and use for desired applications. Thus, the user (PLD 103) or an external device or host may use additional data space 193 as storage for intermediate data, user data, as a scratch-pad, or virtually any desired storage need. Furthermore, PLD 103 and an external device or host may use additional data space 193 as a storage area for exchanging data and information between them, as desired.

Note that if storage device 106 constitutes a non-volatile device (e.g., FLASH memory), its contents will survive a power interruption. The user (through PLD 103) or the external device or host may store information within additional data space 193 that they may use in the future or in the event of a power interruption. Thus, additional data space 193 provides the added advantage of non-volatility under those circumstances.

Figure 5:
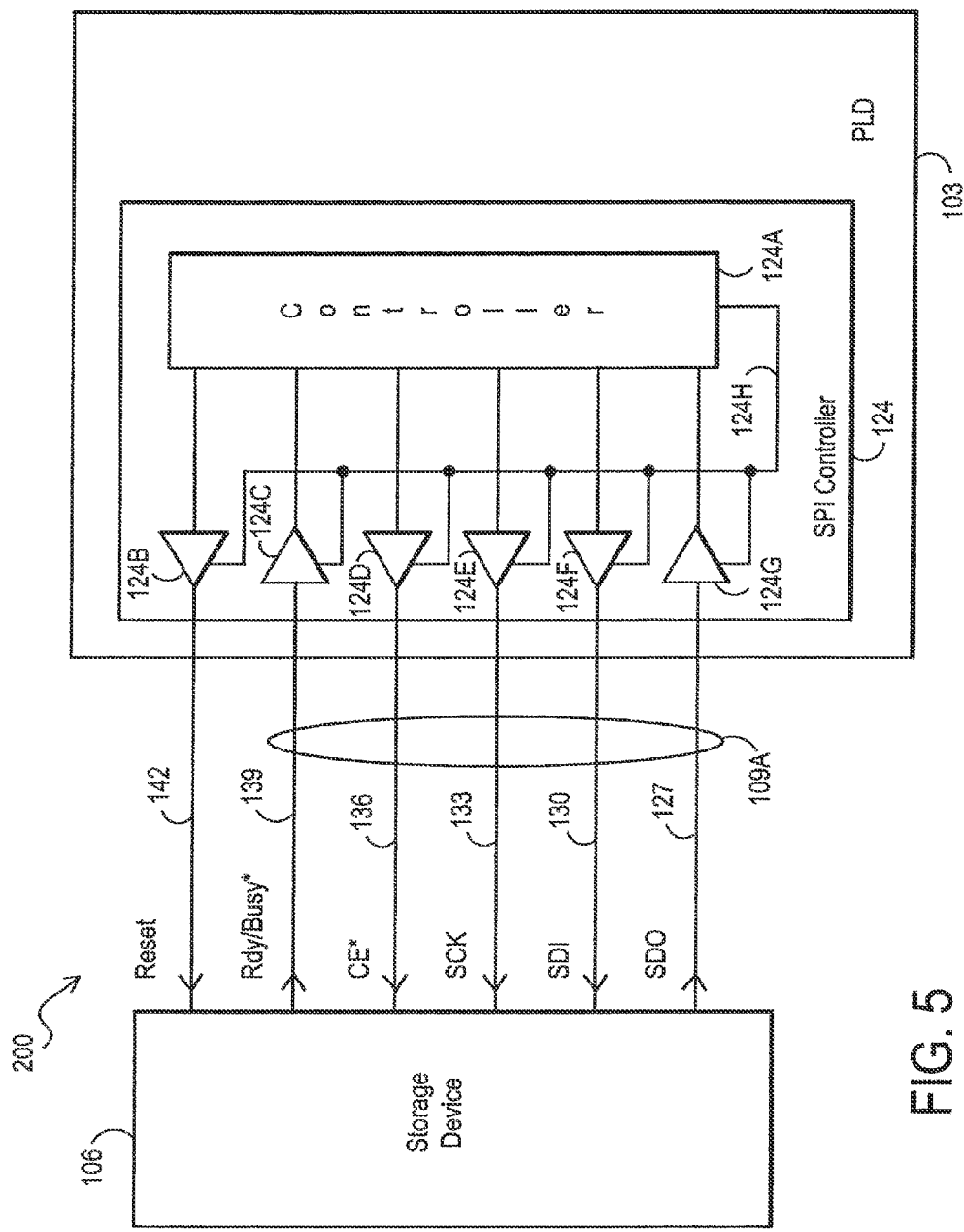
FIG. 5 illustrates a conceptual block diagram of a portion of a PLD according to an exemplary embodiment of the invention that interfaces with a storage device.

As noted above, PLD 103 or an external device or host may access storage device 106. FIG. 5 shows a conceptual block diagram of a portion of PLD 103 according to an exemplary embodiment of the invention that interfaces with storage device 106. PLD 103 in FIG. 5 includes a plurality of tri-state drivers and receivers that interface with storage device 106 via bi-directional serial interface 109A.

SPI controller 124 in PLD 103 includes controller 124A, tri-state receivers 124C and 124G, and tri-state drivers 124B, 124D, 124E, and 124F. Controller 124A communicates with storage device 106 through the tri-state receivers and drivers. Tristate receivers 124C and 124G couple, respectively, Rdy/Busy* signal 139 and SDO signal 127 to controller 124A. Tri-state drivers 124B, 124D, 124E, and 124F couple, respectively, Reset signal 142, CE* signal 136, SCK signal 133, and SDI signal 130 to controller 124A. Controller 124A couples to other circuitry within PLD 103, such as configuration memory 118 and configuration circuitry 121 (see FIG. 2).

When PLD 103 seeks to communicate with storage device 106, SPI controller 124 activates appropriate tri-state devices 124B-124G. On the other hand, when an external device or host seeks to communicate with storage device 106, PLD 103, through SPI controller 124, uses control signal 124H to place tri-state devices 124B-124G in the high-impedance (hi-Z) state. Stated another way, PLD 103 relinquishes control of the interface signals. The external device or host may then drive the various signal lines coupled to storage device 106 to effectuate communication with storage device 106.

Note that FIG. 5 shows a conceptual dual communication mechanism (either PLD 103 or an external device/host may communicate with storage device 106) for a bi-directional serial interface. By making modifications to the circuitry in FIG. 5, one may provide a similar mechanism for a bi-directional parallel interface. The scope of modifications fall within the knowledge of persons of ordinary skill in the art who have the benefit of the description of the invention.

Figure 6:
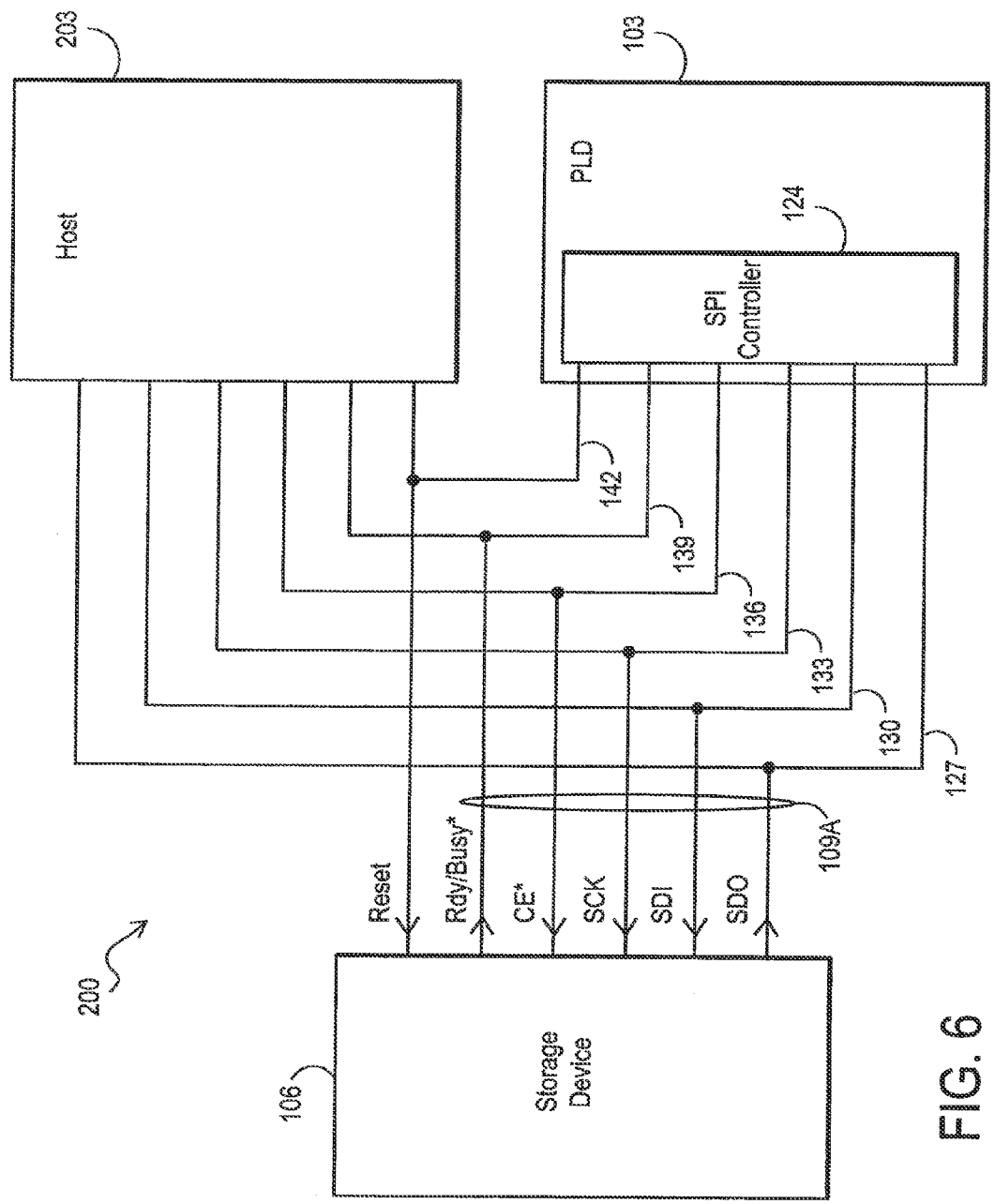
FIG. 6 depicts a circuit arrangement according to the invention for coupling a storage device to a PLD and a host (or an external device) through a bi-directional serial interface.

FIG. 6 shows a circuit arrangement 200 for coupling storage device 106 to PLD 103 and host 203 (or an external device) through a bi-directional serial interface. Signals in serial interface 109A and Reset signal 142 couple to respective terminals of storage device 106, PLD 103, and host 203. Using the mechanism described in connection with FIG. 5, PLD 103 may communicate with storage device 106, or relinquish communication to host 203. Host 203 may include circuitry similar to that shown in FIG. 5 to either communicate with storage device 106 or relinquish communication to PLD 103, as desired.

Using circuit arrangement 203, host 203 and PLD 103 may also communicate with one another, as desired. For example, host 203 may provide data and information to PLD 103 or receive data and information from PLD 103. In one embodiment according to the invention, storage device 106 may initially provide configuration data to PLD 103. Subsequently, host 203 may provide configuration data to PLD 103 (for instance, to re-configure PLD 103 or change its configuration). Thus, circuit arrangement 200 provides a flexible mechanism for communication among storage device 106, PLD 103, and host 203.

Note that FIG. 6 shows a conceptual circuit arrangement for communication mechanism among PLD 103, storage device 106, and host 203 using bi-directional serial interface 109A. By making modifications to the circuitry in FIG. 6, one may provide a similar mechanism for a bi-directional parallel interface. The scope of modifications fall within the knowledge of persons of ordinary skill in the art who have the benefit of the description of the invention.

As noted above, one aspect of the invention contemplates in-system programming (ISP) of the PLD. In-system programming allows the user to re-configure the configuration data in storage device 106 without removing storage device 106 from the system. In-system programming usually begins when the user attaches a programming cable to a socket or receptacle on the system board. PLD 103 senses the attachment of the programming cable and recognizes that the user wishes to engage in-system programming. Typically, storage device 106 (such as a serial FLASH memory) supports a single master. To accommodate that property of storage device 106, PLD 103 relinquishes control of the interface signals to allow in-system programming to proceed, as described below in detail.

Figure 7:
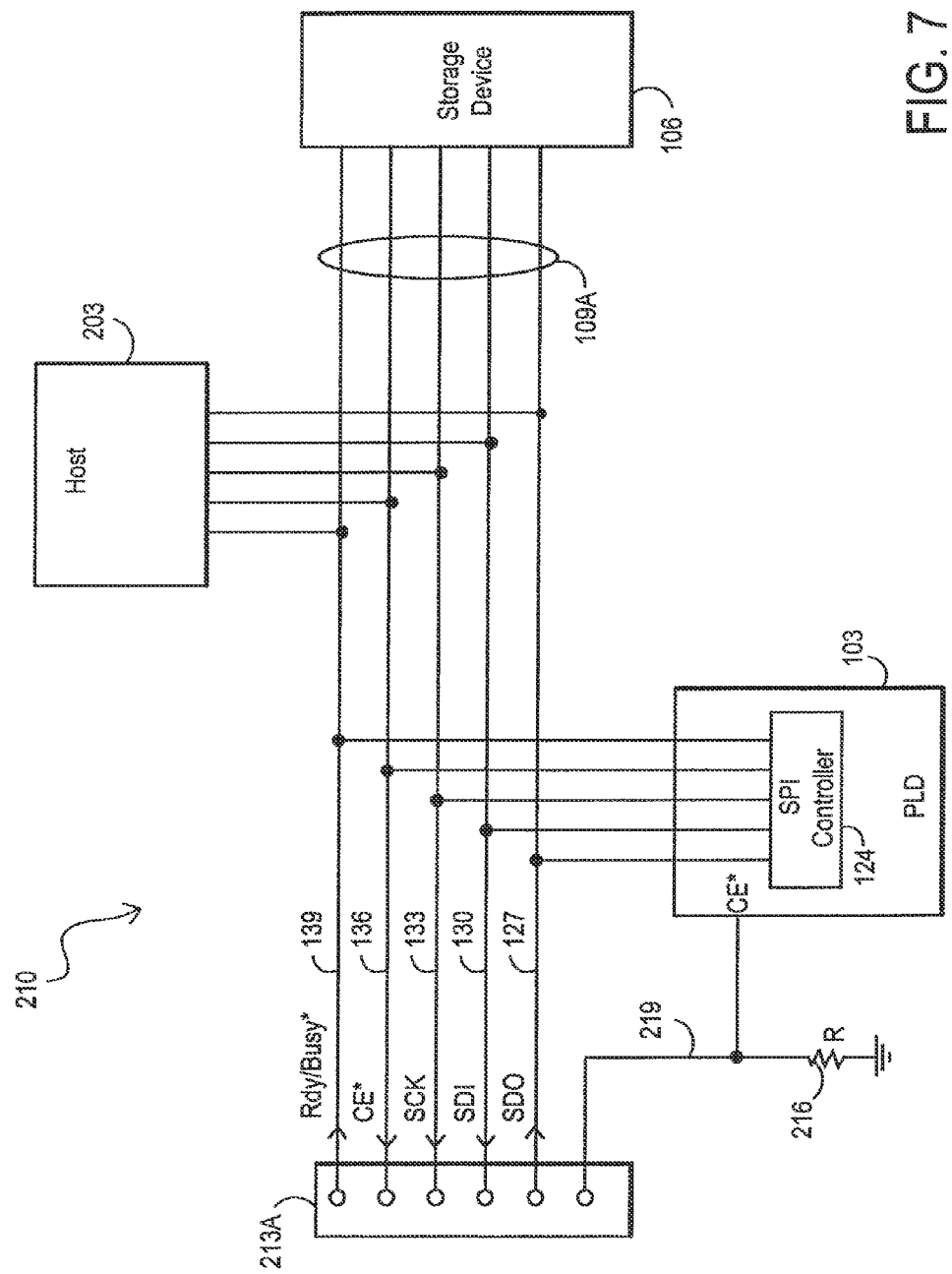
FIG. 7 shows a circuit arrangement according to an exemplary embodiment of the invention that provides in-system programming of a PLD.

FIG. 7 shows a circuit arrangement 210 according to an exemplary embodiment of the invention that provides in-system programming of PLD 103. Circuit arrangement 210 includes a cable connector 213A coupled to storage device 106 and PLD 103 via bi-directional serial interface 109A. Cable connector 213A may reside on a board or other suitable fixture or structure that couples together PLD 103 and storage device 106.

Note that, as desired, one may include on the board host 203 (or an external device), which may couple to PLD 103, storage device 106, and cable connector 213A via bi-directional serial interface 109A. As noted previously, the devices coupled to one another via bi-directional serial interface 109A may communicate to one another as desired, thus providing the user with a flexible data-processing system.

The user signals his or her desire to initiate in-system programming by attaching an external data source via cable connector 213A. The external data source provides an appropriate SPI signal 219 to resistor 216 and the chip-enable input (CE*) of PLD 103. In the absence of an SPI signal 219 supplied via cable connector 213A (i.e., with no external data source attached via cable connector 213A), resistor 216 pulls the CE* input of PLD 103 towards a reference potential, such as circuit ground. As a result, the CE* input of PLD 103 receives a logic low level, which in turn enables PLD 103. PLD 103 may then function as described above.

Figure 8:
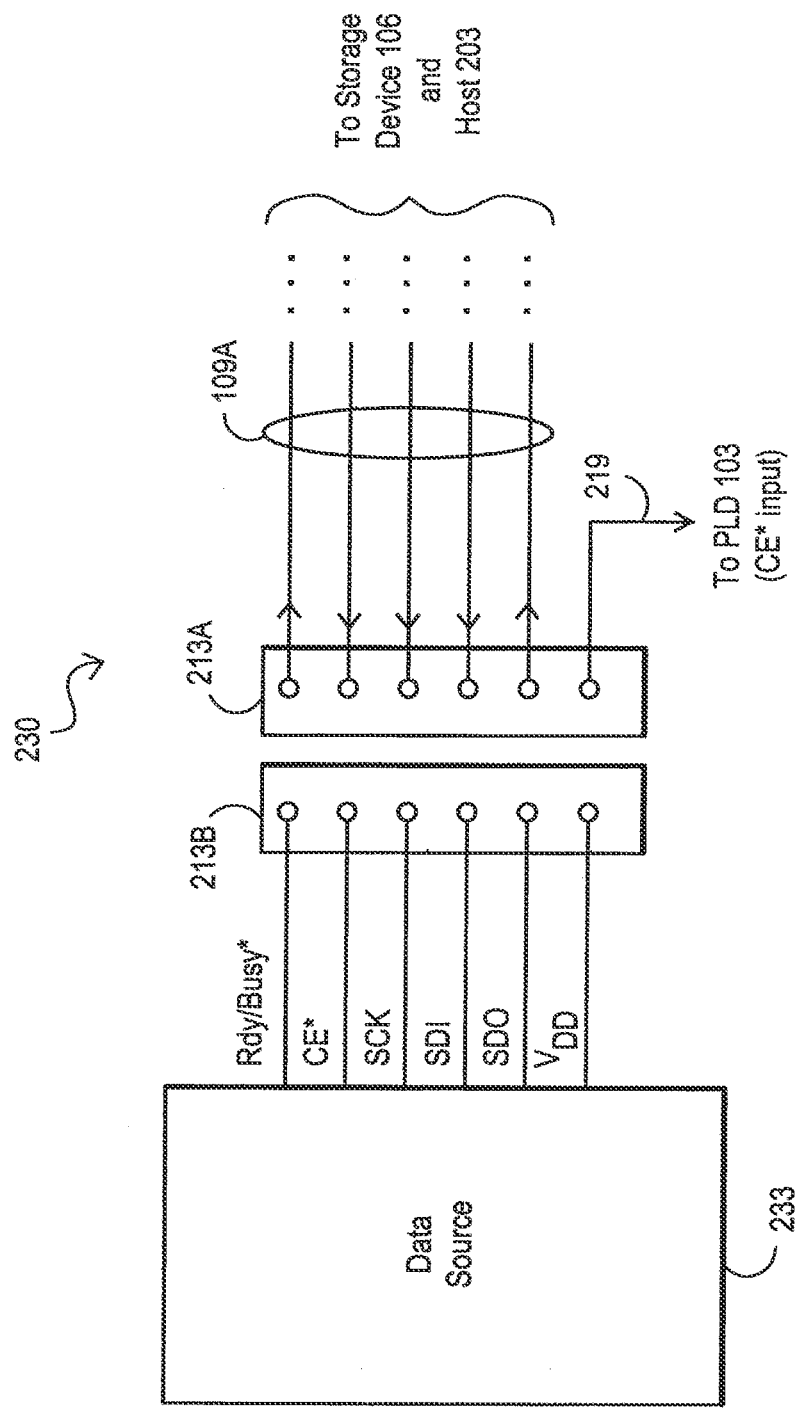
FIG. 8 illustrates a circuit arrangement according to the invention that illustrates how a data source couples to a bi-directional serial interface and a PLD for in-system programming.

If the user wishes to initiate in-system programming, however, he or she couples an external data source to cable connector 213A. FIG. 8 shows a circuit arrangement 230 that illustrates how data source 233 couples to bi-directional serial interface 109 and PLD 103 for in-system programming. Data source 233 may constitute any desired device that communicates data to/from storage device 106, as desired. For example, data source 233 may constitute a personal computer, workstation, microprocessor, host, and the like, as persons of ordinary skill in the art with the benefit of the description of the invention understand.

Data source 233 couples to a cable connector 213B. Cable connector 213A can mate or couple to cable connector 213B to establish electrical communication between data source 233 and PLD 103 (and storage device 106 and host 203). For example, cable connector 213B may constitute a male connector, whereas cable connector 213A may constitute a female connector on the circuit board that houses PLD 103 and other system components. Cable connector 213B may couple to data source 233 via a cable or other suitable coupling mechanism, as desired.

Once data source 233 couples to PLD 103 via cable connectors 213A and 21313, it may provide a suitable signal to the CE* input of PLD 103 to signal that the user wishes to initiate in-system programming. For example, in the embodiments shown in FIGS. 7 and 8, data source 233 supplies a logic high signal (e.g., supply voltage VDD or another suitable signal) to the CE* input of PLD 103.

Once PLD 103 senses the logic high signal at its CE* input, it recognizes that the user wishes to perform in-system programming of storage device 106. In response, PLD 103 finishes any operation it may be conducting (e.g., if the user couples data source 233 in the middle of an operation by PLD 103), and then relinquishes control of the signal lines within bi-directional serial interface 109A. PLD 103 may do so, for example, by placing in tri-state mode the signal lines coupled to SPI controller 124 (see FIG. 5), as described above.

Data source 233 may subsequently act as the master of storage device 106. Data source 233 may proceed with in-system programming by communicating with storage device 106 and exchanging data and information with it. Note that, in addition to, or instead of in-system programming, data source 233 may provide data to any part of storage device 106 (not merely the configuration data space), or receive data from any part of storage device 106, as desired. Furthermore, note that, in addition to in-system programming, one may use the mechanism described here to establish communication between host 203 and data source 233, as desired. Thus, data source 233 may send data to, and receive data from, host 203, as desired.

At the conclusion of the in-system programming or other operations involving data source 233, the user may uncouple cable connector 213B from cable connector 213A. When the user does so, data source 233 no longer supplies a logic high signal to the CE* input of PLD 103. Resistor 216 pulls the CE* input of PLD 103 to a logic low level. Consequently, PLD 103 becomes enabled and may resume its role as the master of storage device 106.

Note that, rather than using the mechanism with resistor 216 and the CE* input of PLD 103 to determine the mode of the interface signals (i.e., what device has control of those signals), one may use an option register within PLD 103 to do so. In other words, an option register within PLD 103 determines what device controls the interface signals (becomes the master) at the conclusion of configuration. The user may configure the register to specify whether PLD 103 should assert control of the interface at the conclusion of configuration.

Another aspect of the invention relates to cascade-mode programming of PLDs. Cascade-mode programming allows one device, such as one storage device 106, to program several PLDs in a sequential manner. The PLDs couple in a chain or cascade. Storage device configures the first PLD first, then followed by the next PLD in the chain or cascade, and so on, until it has configured all PLDs.

Figure 9:
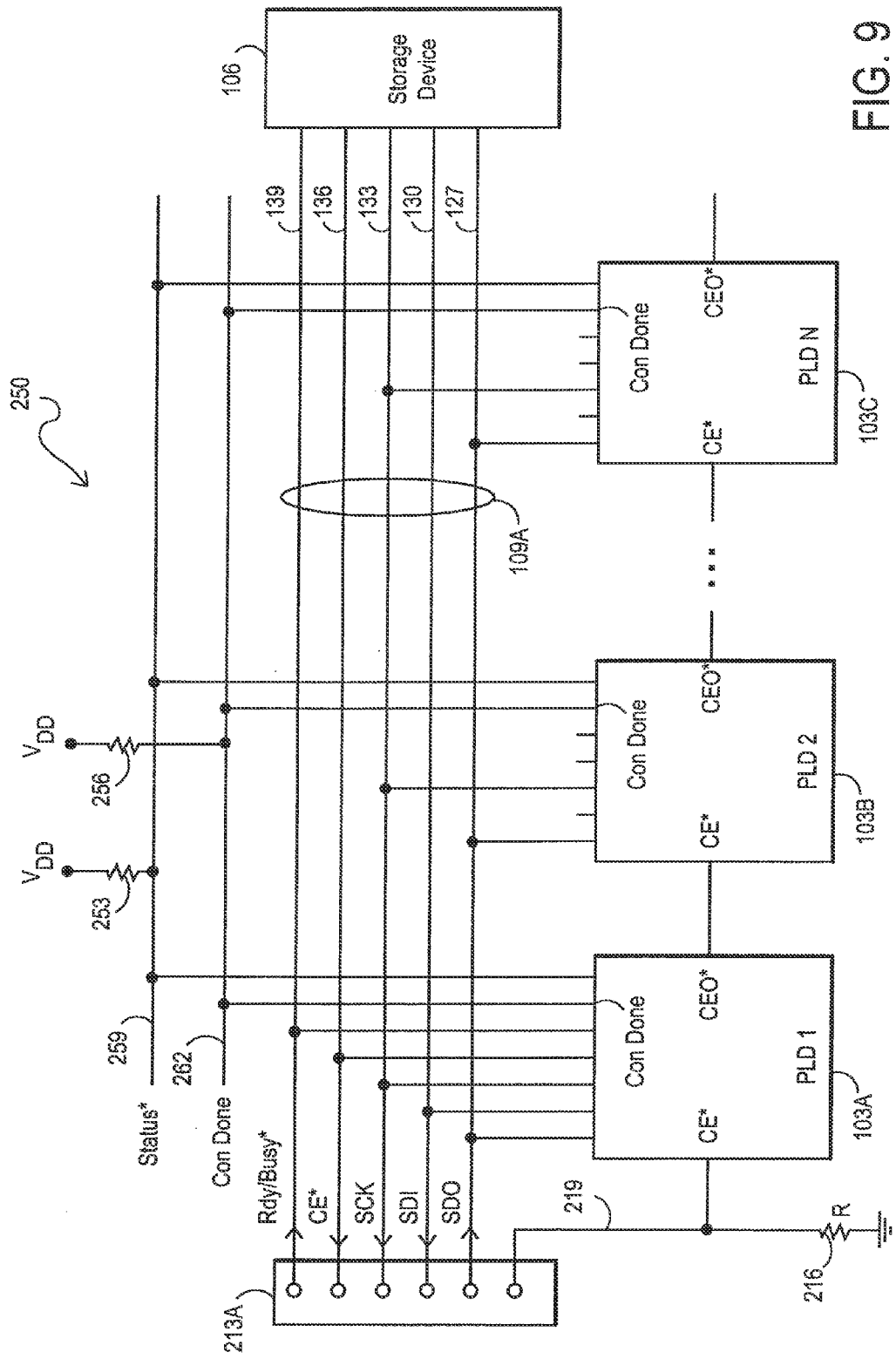
FIG. 9 shows a circuit arrangement for cascade programming of a plurality of PLDs according to an exemplary embodiment of the invention.

FIG. 9 shows a circuit arrangement 250 for cascade programming of a plurality of PLDs according to an exemplary embodiment of the invention. The embodiment shown in FIG. 9 includes PLD 103A coupled to storage device 106 through bi-directional serial interface 109A. PLD 103B and PLD 103C act as slave devices. In other words, in contrast to PLD 103A, PLD 103B and PLD 103C do not act as the master of bi-directional serial interface 109A. PLD 103B and PLD 103C couple to some of the signals in bi-directional serial interface 109A. More specifically, PLD 103B and PLD 103C couple to SDO signal 127 and SCK signal 133 of bi-directional serial interface 109A.

PLDs 103A-103C configure in a sequential manner. At power-up (or upon reset), PLD 103A acts a master of bi-directional serial interface 109A and obtains its configuration data from storage device 106. Once it has finished its own configuration, PLD 103A facilitates configuration of one or more PLDs, denoted as PLD 103B and PLD 103C in FIG. 9.

More specifically, at power-up, PLD 103A asserts a logic high level at its CEO* (chip-enable out) output. The CEO* of PLD 103A drives the CE* input of PLD 103B. Similarly, the CEO* output of PLD 103B drives the CE* input of the next PLD in the chain, and so on, to PLD 103C at the end of the chain. A logic high level on the CEO* output of PLD 103A prevents PLD 103B from trying to access data on bi-directional serial interface 109A. Likewise, a logic high at the CE* input of PLD 103B causes a logic high level at its CEO* output, which causes the next PLD in the chain from accessing data on bi-directional serial interface 109A, and so on.

Thus, at power-up, PLD 103A acts as the master and takes appropriate steps to obtain its configuration data from storage device 106. In an illustrative embodiment, storage device 106 constitutes a serial FLASH memory. PLD 103A in that embodiment provides appropriate op codes and a clock signal (via SCK signal 133) to the serial FLASH memory that cause the memory to access configuration data within the memory and to provide the data to PLD 103A. PLD 103A further provides a clock signal (via SCK signal 133) to PLDs 103B-103C. Also at power-up all of the PLDs in the chain pull configuration-done (ConDone) signal 262 to a logic low level.

Once it has obtained its configuration data, PLD 103A asserts a logic low level at its CEO* output, thus enabling 103B. PLD 103A also tri-states its ConDone output. PLD 103A, however, continues to cause storage device 106 to provide configuration data (e.g., by sending the appropriate op codes and clock signal to a serial FLASH memory that serves as storage device 106). PLD 103A also monitors the status of ConDone signal 262.

Once PLD 103B has become enabled (via a logic low level at the CEO* output of PLD 103A), it starts obtaining configuration data via SDO signal 127 of bi-directional serial interface. PLD 103B continues this process until it has obtained its configuration data. At that point, PLD 103B asserts a logic low level at its CEO* output, thus enabling the next PLD in the chain of PLDs. PLD 103B also tri-states its ConDone output.

PLD 103A continues to cause storage device 106 to provide configuration data, which the next PLD in the chain uses as its configuration data. This process continues until the last PLD in the chain, PLD 103C, obtains its configuration data. At that point, PLD 103C tri-states its ConDone output. Once all PLDs have tri-stated their ConDone outputs, resistor 256 pulls ConDone signal 262 to a logic high level. Through monitoring ConDone signal 262, PLD 103A detects the logic high level of ConDone signal 262, which it interprets as all PLDs in the chain having obtained their configuration data from storage device 106. Thus, sequential configuration of PLDs 103A-103C concludes. Note that, rather than, or in addition to, PLD 103A monitoring ConDone signal 262, another device, such as a host, may monitor that signal to ascertain information about the configuration of the PLDs in the chain.

Each PLD in the chain of PLDs has a Status output that couples to Status* signal 259. As each PLD in the chain successfully concludes its configuration, it tri-states its Status output. If any PLD encounters an error, however, it asserts a logic low level at its Status output. Thus, if all PLDs in the chain successfully configure, resistor 253 pulls Status* signal 259 to a logic high level. If at the conclusion of the configuration process (as ConDone signal 262 indicates) one or more of the PLDs has asserted a logic low level at its Status output (to indicate an error in configuration), Status* signal 259 will have a logic low level.

PLD 103A (and/or a host or other device) may monitor the Status* signal 259 to determine whether any PLD in the chain has encountered an error during the configuration process. If so, PLD 103A may start re-configuration again and repeat the above process to configure the PLDs in the chain.

One may provide in-system programming capability to circuit arrangement 250, as desired. To combine in-system programming with cascade programming, one may use cable connector 213A and resistor 216 in connection with the CE* input of PLD 103A. The in-system programming feature operates as described above in detail with respect to FIGS. 7-8.

Note that, rather than having PLD 103A serve as a master (and PLDs 103B-103C serve as slaves), one may have all PLDs in the chain serve as master devices. In such an embodiment, all PLDs would couple to bi-directional serial interface 109A as does PLD 103A in FIG. 9. The first PLD in the chain completes its configuration and places tri-states the pins that couple to bi-directional serial interface 109A. Using the CEO* output mechanism described above, the PLD may then signal the next PLD in the chain to obtain configuration data from storage device 106. This process repeats until all PLDs in the chain have obtained configuration data from storage device 106.

As persons of ordinary skill in the art with the benefit of the description of the invention understand, one may make many modifications to the circuit arrangements shown in FIGS. 7-9, as desired, that use the inventive concepts described here. For example, one may use fewer, more, or different signals and pins or connectors in the cable connectors or interfaces, as desired. Furthermore, by modifying the circuit arrangements shown, one may use parallel interfaces, such as bi-directional parallel interface 109B described above, as desired (together with a parallel-interface storage device 106). The modifications depend on the design and performance specifications for a particular implementation and, as noted, fall within the knowledge of persons skilled in the art who have the benefit of the description of the invention.

Figure 10:
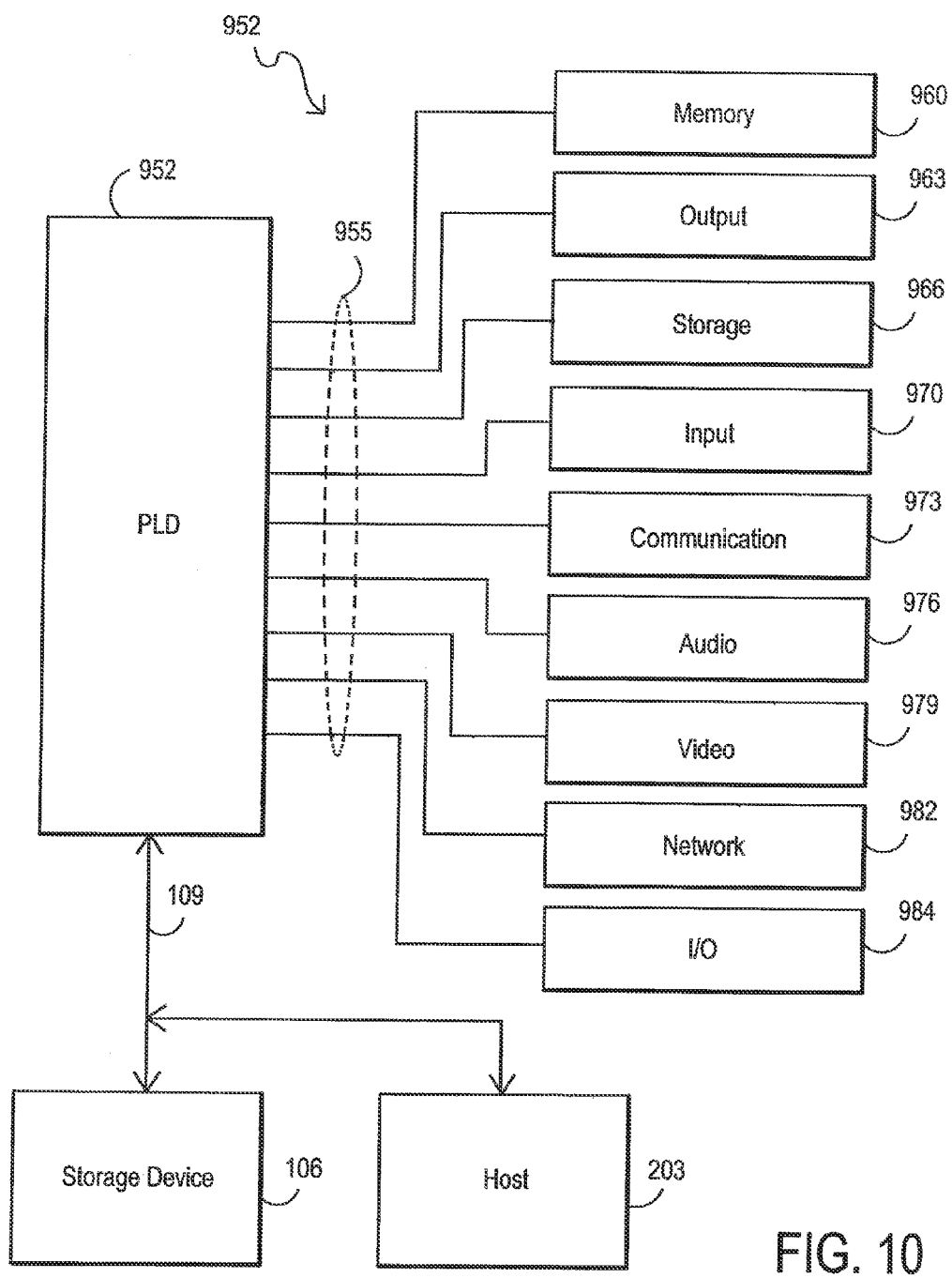
FIG. 10 illustrates an illustrative embodiment according to the invention of a data-processing system that includes a PLD.

One may use PLDs and configuration devices (storage devices) and corresponding bi-directional interfaces according to the invention, such as those described above, in a variety of data-processing systems and applications. FIG. 10 shows an illustrative embodiment 950 of a data-processing system that includes PLD 952 according to the invention (although one may include more than one PLD 952 in embodiment 950, as desired). PLD 952 may be similar to, or the same as, the PLDs described in this application (e.g., PLD 103 or PLD 103A), as desired. PLD 952 couples to storage device 106 via bi-directional interface 109. PLD 952 may also couple to optional host (or external device) 203, as desired, and as described above.

Embodiment 950 optionally includes a plurality of peripherals 960-984 that couple to PLD 952 via a plurality of signal links 955. Signal links 955 may constitute any suitable signal lines or a collection of a plurality of signal lines (i.e., a plurality of signal lines coupled to each of peripherals 960-984, and the collection of the plurality of signal lines constituting signal links 955). For example, signal links 955 may constitute one or more buses or other communication and coupling mechanisms, as persons of ordinary skill in the art with the benefit of the description of the invention understand. Note that embodiment 950 may exclude some of peripherals 960-984 or include a plurality of some or all of peripherals 960-984, as desired. PLD 952 may also include one or more processors (not shown explicitly), which may couple to various parts of PLD 952 and/or peripherals 960-984, as desired. Furthermore, PLD 952 may couple to, and operate in conjunction with, one or more processors (not shown explicitly) external to PLD 952, as desired.

The illustrative embodiments of the invention described above refer to PLDs. Note, however, that one may apply the inventive concepts effectively to circuitry known by other names in the art, such as complex programmable logic device (CPLD), programmable gate array (PGA), and field programmable gate array (FPGA), as desired. The choice of circuitry depends on the design and performance specifications for a particular application and depends on factors that fall within the knowledge of persons skilled in the art with the benefit of the description of the invention.

Although the description of the invention sometimes refers to specific sizes of inputs, outputs, and the like, one may apply the circuitry and inventive concepts described to a wide variety of other situations. For example, one may modify and generalize the circuitry and concepts to accommodate other sizes of the various variables, such as input sizes, output sizes, number of inputs, outputs, and signals, and the like. Such modifications fall within the knowledge of persons of ordinary skill in the art who have the benefit of the description of the invention.

Referring to the figures, the various blocks shown depict mainly the conceptual functions and signal flow. The actual circuit implementation may or may not contain separately identifiable hardware for the various functional blocks. For example, one may combine the functionality of various blocks into one circuit block, as desired. Furthermore, one may realize the functionality of a single block in several circuit blocks, as desired. The choice of circuit implementation depends on various factors, such as particular design and performance specifications for a given implementation, as persons of ordinary skill in the art who have the benefit of the description of the invention understand.

Other modifications and alternative embodiments of the invention in addition to those described here will be apparent to persons of ordinary skill in the art who have the benefit of the description of the invention. Accordingly, this description teaches those skilled in the art the manner of carrying out the invention and are to be construed as illustrative only. The forms of the invention shown and described should be taken as the presently preferred embodiments. Persons skilled in the art may make various changes in the shape, size and arrangement of parts without departing from the scope of the invention described in this document. For example, persons skilled in the art may substitute equivalent elements for the elements illustrated and described here. Moreover, persons skilled in the art who have the benefit of this description of the invention may use certain features of the invention independently of the use of other features, without departing from the scope of the invention.

What is claimed is:

1. A memory interface comprising:
a data output signal for providing, from a memory circuit, configuration data for configuring at least one of a first integrated circuit and a second integrated circuit; and
a data input signal for providing an operation code from the first integrated circuit to the memory circuit, wherein:
the first integrated circuit is configured to initiate its configuration by providing the operation code to the memory device via the data input signal of the memory interface, and
the first integrated circuit is configured to initiate configuration of the second integrated circuit by passing a signal to the second integrated circuit.

2. The memory interface of claim 1, wherein a chip enable output of the first integrated circuit couples to a chip enable input of the second integrated circuit and wherein passing a signal to the second integrated circuit comprises asserting a chip enable signal from the chip enable output of the first integrated circuit to the chip enable input of the second integrated circuit.

3. The memory interface of claim 1, wherein the memory interface further comprises a chip enable signal to perform at least one of the group of selecting, deselecting, enabling, and disabling the memory circuit.

4. The memory interface of claim 1, wherein the memory interface further comprises a handshaking signal for indicating availability of the memory circuit to the first integrated circuit.

5. The memory interface of claim 1, wherein the memory interface further comprises a clock signal for providing one or more clock signals from the first integrated circuit to the memory circuit.

6. The memory interface of claim 5, wherein the first integrated circuit provides the one or more clock signals and the operation code to the memory circuit and wherein the memory circuit provides the configuration data to the first integrated circuit in response to the one or more clock signals and the operation code.

7. The memory interface of claim 1, wherein the first integrated circuit passes the signal to the second integrated circuit after the first integrated circuit is configured, such that the second integrated circuit begins to be configured.

8. A method of coupling a first integrated circuit, a second integrated circuit, and a memory circuit via a memory interface, the method comprising:
providing, from the memory circuit via the memory interface, configuration data for configuring at least one of the first integrated circuit and the second integrated circuit;
providing an operation code via the memory interface data from the first integrated circuit to the memory circuit;
initiating the configuration of the first integrated circuit by the first integrated circuit in response to said providing the operation code from the first integrated circuit to the memory device; and
initiating configuration of the second integrated circuit by the first integrated circuit in response to passing a signal from the first integrated circuit to the second integrated circuit.

9. The method of claim 8, wherein said passing the signal from the first integrated circuit to the second integrated circuit comprises asserting a chip enable signal to the second integrated circuit.

10. The method of claim 8, further comprising selecting the memory circuit for communication, via a chip enable signal of the memory interface.

11. The method of claim 8, further comprising providing a handshaking signal from the memory circuit to indicate availability of the memory circuit to the first integrated circuit.

12. The method of claim 8, further comprising providing one or more clock signals from the first integrated circuit to the memory circuit.

13. The method of claim 12, further comprising:
providing the one or more clock signals and the operation code from the first integrated circuit to the memory circuit; and
providing the configuration data from the memory circuit to the first integrated circuit in response to the one or more clock signals and the operation code.

14. The method of claim 8, further comprising passing the signal from the first integrated circuit to the second integrated circuit after the first integrated circuit is configured, such that the second integrated circuit begins to be configured.

15. A memory interface comprising:
a plurality of data signals for providing, from a memory circuit, configuration data for configuring at least one of a first integrated circuit and a second integrated circuit; and
a plurality of address signals for providing an address from the first integrated circuit to the memory circuit, wherein:
the first integrated circuit is configured to initiate its configuration by providing the address to the memory device via the plurality of data signals of the memory interface, and
the first integrated circuit is configured to initiate configuration of the second integrated circuit by passing a signal to the second integrated circuit.

16. The memory interface of claim 15, wherein a chip enable output of the first integrated circuit couples to a chip enable input of the second integrated circuit and wherein passing a signal to the second integrated circuit comprises asserting a chip enable signal from the chip enable output of the first integrated circuit to the chip enable input of the second integrated circuit.

17. The memory interface of claim 15, wherein the memory interface further comprises a chip enable signal to perform at least one of the group of selecting, deselecting, enabling, and disabling the memory circuit.

18. The memory interface of claim 15, wherein the first integrated circuit passes the signal to the second integrated circuit after the first integrated circuit is configured, such that the second integrated circuit begins to be configured.

19. The memory interface of claim 15, wherein the first integrated circuit is a programmable logic device.

20. The memory interface of claim 15, wherein during a first time the first integrated circuit acts as a master device of the memory interface, and during a second time the second integrated circuit acts as the master device of the memory interface.

* * * * *